United States Patent [19]

Itoh et al.

[11] Patent Number: 4,868,420
[45] Date of Patent: Sep. 19, 1989

[54] FLIP-FLOP CIRCUIT

[75] Inventors: Hiroyuki Itoh, Kodaira; Masayoshi Yagyu; Toshio Yamada, both of Kokubunji; Masaru Osanai, Hachioji; Akira Masaki, Musashino; Mitsuo Usami, Suginami; Tohru Kobayashi, Iruma; Masato Hamamoto, Ome, all of Japan

[73] Assignee: Hitachi, Ltd., Tokyo, Japan

[21] Appl. No.: 273,729

[22] Filed: Nov. 18, 1988

Related U.S. Application Data

[63] Continuation of Ser. No. 20,892, Mar. 2, 1987, abandoned, which is a continuation-in-part of Ser. No. 820,325, Jan. 21, 1986, abandoned.

[30] Foreign Application Priority Data

Jan. 23, 1985 [JP]  Japan .................................. 60-8979
Jun. 27, 1986 [JP]  Japan ................................ 61-149472

[51] Int. Cl.⁴ ...................... H03K 19/03; H03K 19/07
[52] U.S. Cl. .................................. 307/441; 307/442; 307/443; 307/455; 307/272.1
[58] Field of Search ................... 307/455, 467, 272 R, 307/272 A, 441, 442, 443

[56] References Cited

U.S. PATENT DOCUMENTS

| | | | |
|---|---|---|---|
| 3,201,701 | 8/1965 | Maitra | 307/441 |
| 3,305,830 | 2/1967 | Constantine Jr. | 307/441 |
| 3,543,048 | 11/1970 | Klaschka | 307/441 |
| 4,072,869 | 2/1978 | Gillow | 307/291 |
| 4,506,165 | 3/1985 | Gulati et al. | 307/272 A |

Primary Examiner—Stanley D. Miller
Assistant Examiner—Richard Roseen
Attorney, Agent, or Firm—Antonelli, Terry & Wands

[57] ABSTRACT

An improved flip-flop circuit is provided which prevents the occurrence of soft errors due to α rays and the like emitted from a trace amount of radioactive materials contained in a semiconductor package material. The flip-flop circuit has a first logic circuit which holds data and produces a first logic signal and a second logic circuit which produces a second logic signal. A logic gate receives the first and second logic signals that are produced from the first and second logic circuits and which have the same logic level. The output of the logic gate is input to the first logic circuit through a feedback loop which is provided between the output and the input of the first logic circuit and which includes the logic gate. According to the circuit construction of the present invention, a flip-flop circuit can be accomplished which is resistant to the radioactive rays such as α rays and does not cause soft errors.

28 Claims, 19 Drawing Sheets

FLIP-FLOP CIRCUIT

This application is a continuation of application Ser. No. 020,892, filed on Mar. 2, 1987 now abandoned, which is a continuation-in-part application of application Ser. No. 820,325, filed Jan. 21, 1986, now abandoned.

BACKGROUND OF THE INVENTION

This invention relates generally to a flip-flop circuit for temporarily storing data in a logic device, and more particularly to an improved flip-flop circuit which prevents the occurrence of a soft error due to $\alpha$ rays and the like emitted from a trace amount of radioactive materials in a package material of a semiconductor.

FIG. 28 of the accompanying drawings illustrates an example of the logic construction of a flip-flop circuit. This circuit outputs the content of a data input 101 applied thereto through an input terminal $In_1$ to an output signal terminal 104 when a clock signal 102 is at a logic "1" and also outputs the inversed content of the data input 101 to an inversed output terminal 103. When the clock signal 102 is at a logic "0", the circuit stores the content of the data input 101 at the time when the clock signal 102 is previously at the logic "1", and outputs the memory content to the output signal terminal 104 and the inversed memory content to the inversed output signal terminal 103. In the drawing, reference numeral 109A represents an inverter, 106A to 106C are OR gates, 107 is an AND gate and 105 in a feedback signal line.

FIG. 29 is a conventional circuit diagram to accomplish the flip-flop circuit shown in FIG. 28. This circuit uses an emitter coupled logic (hereinafter referred to as "ECL") as a basic gate, and each gate is constituted so as to correspond to each of the constant current generators 1118, 1128 and 1138. Let's consider the gate corresponding to the constant current generator 1118. The input terminal of this gate is the base of each of the transistors 1111 and 1112, and its NOR output and OR output can be obtained from the common collector of the transistors 1111, 1112 and the collector of the transistor 1113. This also holds true of the other gates.

Next, the operation in FIG. 29 which corresponds to the AND gate 107 of FIG. 28 will be described. In the circuit shown in FIG. 29, the OR output of each of the three gates is obtained from the collector of the transistor 1113, 1123, 1133 as described above, and these three collectors in this circuit are wired (1103) in common and are outputted to 104 through an emitter follower transistor 1101. This wiring 1103 can logically provide AND from the OR outputs of the three gates. On the other hand, the NOR output of each gate is outputted through the emitter follower transistor 1114, 1124, 1134, and the emitters of these three transistors are wired (1104) in common. Therefore, the NOR outputs of these three gates can logically provide OR. According to the De Morgan's rules, this is equivalent to the negation of AND of the OR output, so that the circuit construction shown in FIG. 29 can provide the output signal 104 and the inversed output signal 103 in the same way as the circuit shown in FIG. 28. For the detail of the circuits shown in FIGS. 28 and 29, refer to the specification of Japanese Patent Laid-Open Patent No. 198921/1983.

It has been clarified recently that $\alpha$ rays emitted from a trace amount of radioactive materials in a package material of a semiconductor causes a soft error of memories and flip-flop circuits. FIG. 30 shows the case where the $\alpha$ ray is incident to a bipolar transistor as an example of a semiconductor chip. Reference numerals 126, 127 and 129 represent emitter, base and collector regions, respectively, and reference numeral 130 does a depletion layer of a PN junction formed by the collector 129 and a substrate 131. When the $\alpha$ ray is incident, electron-hole pairs are generated along the orbit 120 of the $\alpha$ ray. Among these electron-hole pairs generated in these regions, it is the electron-hole pair developing in the depletion layer 130 and the substrate 131 that exerts the greatest influences.

Let's consider the electrons. The electrons generated in the depletion layer 130 are attracted to the collector by the electric field of the PN junction. The electrons generated in the substrate 131 reach the depletion layer 130 due to diffusion and are likewise attracted to the collector. Therefore, the influence of the incident $\alpha$ ray appears as noise on current, and this current flows from the collector of the transistor, to which the $\alpha$ ray is incident, to the substrate.

Though the description given above deals with the bipolar transistor, the situation is the same with memory or logic LSIs. The report on the soft error of bipolar memories is described, for example, in "Transactions of the Institute of Electronics and Communication Engineers", Vol. 63-C, No. 2 (1980-2), (Mitsusada et al; "Soft Error of High Speed Bipolar RAM due to $\alpha$ particles"). On the other hand, no report has yet been made on the occurrence of the soft error in logic LSIs. This is because a circuit current is greater in the logic LSI than in the memory LSI and the signal amplitude is also greater. However, since it is expected that the miniaturization of devices will further proceed and their performance will become higher and higher in future with a decreasing parasitic capacity, the amount of stored charge will also decrease and the soft error will become a problem in the logic LSI, too.

As the problem inherent to the logic LSI, the following problem can be pointed out. Since the number of signal pins is great in the logic LSI, a chip bonding method which is referred to as CCB ("Controlled Collapse Bonding") has been used in place of conventional wire bonding (for example, "IEEE Journal of Solid State Circuits", Vol. SC-14, No. 5, pp. 818–822 (1979-11)). According to this method, solder balls are placed on the entire surface of the chip, but the radioactive isotopes (e.g. Ra, Am) contained as impurities in the solder will result in the soft error of the logic LSI. Since the solder ball is bonded to the chip, it becomes impossible to cut off the $\alpha$ ray by covering the chip by any material, for instance, and hence those circuits which are highly resistant to the $\alpha$ rays will become necessary.

SUMMARY OF THE INVENTION

It is therefore an object of the present invention to provide a flip-flop circuit which is resistant to radioactive rays such as the $\alpha$ ray and which does not cause the soft error.

To accomplish this object, the present invention uses two feedback signals. In other words, in addition to the conventional feedback signal, the present invention uses another feedback signal obtained by calculating logic OR between the conventional feedback signal and an inversed signal of a signal having the opposite phase to the conventional feedback signal and obtained independently, or by calculating logic OR between the conventional feedback signal and another signal having exactly the same phase. In order for the feedback signals to cause the error that is an unintended transition of the signal from a High logic level to a Low logic level, the two signals providing the logic OR must simultaneously cause the error, and this probability is extremely small. Therefore, the soft error can be reduced drastically.

DESCRIPTION OF THE PREFERRED EMBODIMENTS

The problem of a flip-flop circuit which is subject to errors caused by the α ray will be described in detail with reference to a bipolar transistor as an example prior to the description of the preferred embodiments of the invention.

Figure 31:
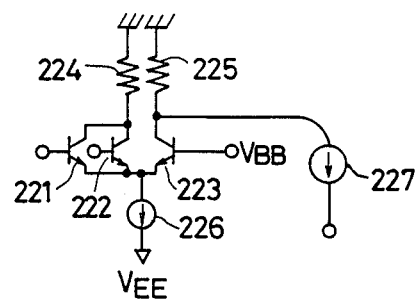
FIG. 31 is an equivalent circuit diagram showing the noise on current by the α ray, by an ECL circuit.
Figure 32:
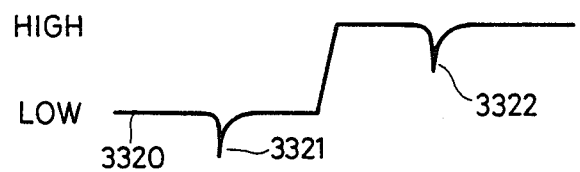
FIG. 32 is a diagram showing the noise on current by the α ray in terms of a collector potential output.

FIG. 31 shows a current switching portion of an ECL circuit and also shows equivalently the noise on current by the α ray. The drawing illustrates the case where the α ray is incident to a transistor 223, and the noise source is represented by reference numeral 227. FIG. 32 shows a collector output signal having the noise by the α ray. Reference numeral 3320 represents the collector potential of the transistor 223 in FIG. 31, for example, and the noises such as 3321 and 3322 are generated by the α ray noise source 227.

Figure 29:
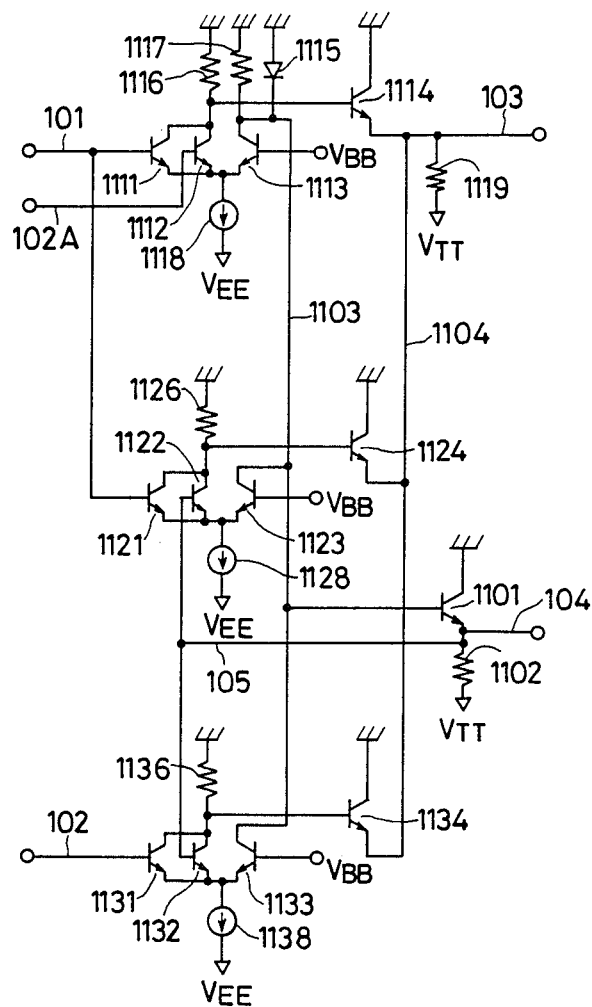
FIG. 29 is a definite circuit diagram for embodying the flip-flop circuit shown in FIG. 28.

Next, how the data of the flip-flop is lost by this noise will be explained. As shown in FIG. 29, the feedback signal line 105 of the flip-flop is wired to the bases of the transistors 1122, 1132 as the input terminal of the gate from the collectors of the transistors 1113, 1123 and 1133 that are wired in common, through the emitter follower transistor 1101. Therefore, when the α ray is incident to any of the transistors 1113, 1123 and 1133, spikes 3321 and 3322 shown in FIG. 32 develop at its common collector and are fed back. If the collector potential is at the low level in this case, the noise 3321 only reduces further the potential even if the noise occurs, so that the Low data of the flip-flop is not lost.

If the collector potential is at the High level, on the other hand, and if the noise 3322 is then fed back, the feedback potential comes close to the reference voltage $V_{BB}$. If the noise is great, therefore, the feedback potential that must originally be at the logically High level drops below $V_{BB}$ so that the current of the ECL circuit is changed over and the data of the flip-flop is lost.

Figure 30:
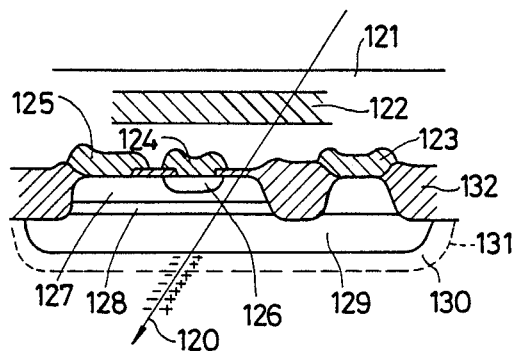
FIG. 30 is a schematic view showing the state when an α ray is incident to a semiconductor chip.

The mechanism of the soft error is the same not only in the ECL circuit but also other in bipolar circuits such as TTL (transistor logic) circuits, due to the drop of the collector potential. In the case of field effect transistors (FETs), too, the same error occurs because the source and drain of FET correspond to the collector layer 129 of the bipolar transistor shown in FIG. 30. In other words, when the α ray is incident, the current flows from the drain to the substrate in the case of an N-channel, and the drain potential drops.

Figure 1:
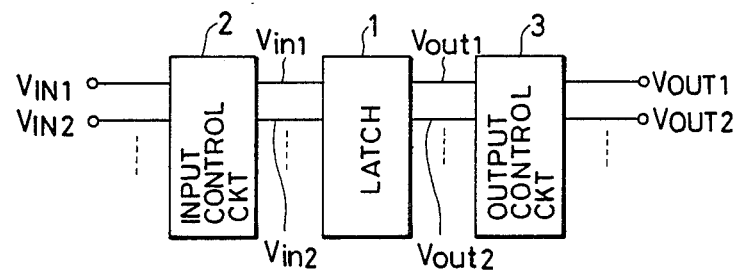
FIG. 1 is a schematic view of the present invention.

FIG. 1 is a conceptual structural view of the present invention. Reference numeral 1 represents a circuit that contains a feedback loop and is a minimum necessary unit for storing data. This unit will be hereinafter referred to as a "latch", and a circuit consisting of an input control circuit 2 for supplying input signals $V_{in1}$, $V_{in2}$ and the like to the latch 1 and an output control circuit 3 for controlling the output signals $V_{out1}$, $V_{out2}$ and the like from the latch 1 will be hereinafter referred to as a "flip-flop circuit". The flip-flop circuit in accordance with the present invention is characterized in that a device causing the error among devices that constitute the feedback loop in the conventional latch is doubled so that the soft error due to the α ray and the like does not affect the hold operation of the latch.

If the number of flip-flop units is merely doubled twice as many flip-flops are necessary, and an error comparator or comparators will become further necessary and thus, the number of necessary circuits becomes enormous.

In accordance with the present invention, only the device which can cause the soft error is doubled, and two signals are processed in accordance with error modes that could occur. Therefore, the present invention can reduce the soft error effectively and drastically while minimizing the increase of the number of devices due to doubling.

Figure 2:
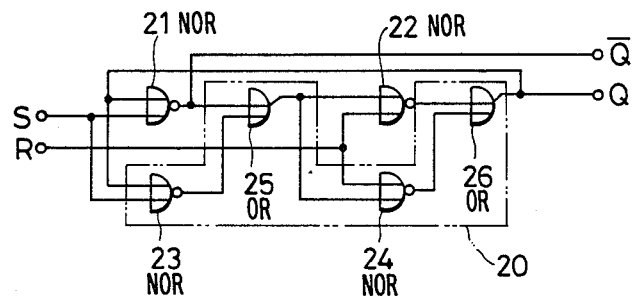
FIG. 2 is a structural view of a circuit when the present invention is applied to an RS latch circuit.

FIG. 2 illustrates an example of the latch 1 to be used in the present invention. The drawing shows an RS latch using NOR gates, and the operations of the conventional circuits such as the RS latch are described in Y. Yokoi, "Digital IC Practical Circuits Manual" (Radio Technique Co.), for example. In FIG. 2, a circuit within dash lines 20 is added to the conventional circuit. Doubling is made by NOR gates 23 and 24 so as to correspond to the NOR gates 21 and 22. Assuming that an error mode from the High logic level to the Low logic level occurs due to the incident α ray, the error signal is not fed back to the NOR gate 21 and 22 because OR gates 25 and 26 operate as discussed hereinafter. For instance, when Q is at the High level, the output of the NOR gates 22 and 24 is at the High level. Even if the α ray is incident to the gate 22 or 24, Q never attains the Low level because one of the inputs of the OR gate 26 is at High level and the output is also at the High level, unless the α ray is incident simultaneously to both the gate 22 and 24.

Figure 3:
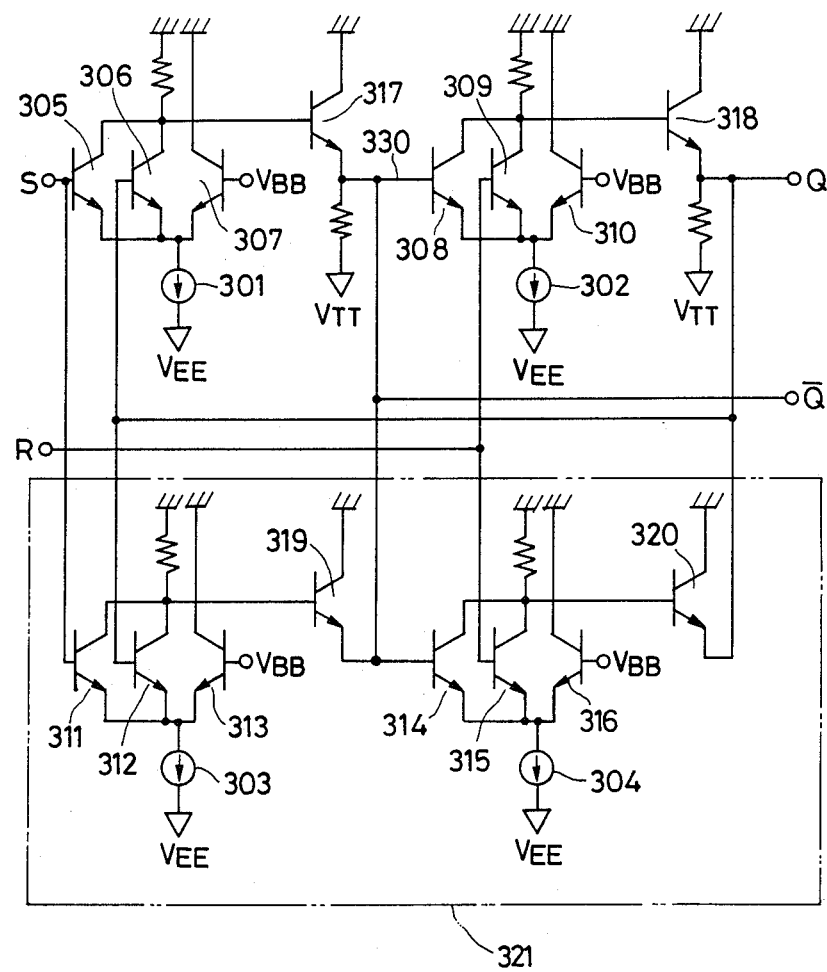
FIG. 3 is a circuit diagram when the circuit shown in FIG. 2 is embodied.

FIG. 3 shows an example of the definite circuit of FIG. 2. The drawing shows the case where a bipolar ECL circuit is employed. The circuit consists of constant current generators 301, 302, 303, 304, differential circuits connected to the constant current generators and emitter follower circuits 317, 318, 319, 320.

The gate circuit constituted by the current switching portion having the constant current generator 301 corresponds to the gate 21 shown in FIG. 2. Similarly, the current switching portion having the constant current generator 302, 303 respective 304 corresponds to the respective gate 22, 23, 24, shown in FIG. 2. The circuit within dash lines 321 corresponds to the gates within dash lines 20 in FIG. 2. Therefore, this embodiment has doubled gate construction. Even if the α ray is incident to the transistor 305 or 306 and the error mode from the High logical level to the Low level occurs, the collector potential of the transistors 311, 312 of the doubled gate maintains the High level, so that the wired-OR output 330 does not cause any level change and the error signal is not fed back. Similarly, since the gate constituted by the current switching portion having the constant current generator 302 is doubled by the gate constituted by the current switching portion having the constant current generator 304, the situation is also the same in this case as described above.

The transistors 317 and 319 that together constitute the wired-OR correspond to OR gate 25 shown in FIG. 2. Even if the α ray is incident to the transistors 317 and 319, no adverse influence is exerted upon the output 330 because the transistors constitute the emitter follower circuits whose collector sides are grounded. This is also the same as to the wired-OR constituted by the emitter follower transistors 318 and 320.

Figure 4:
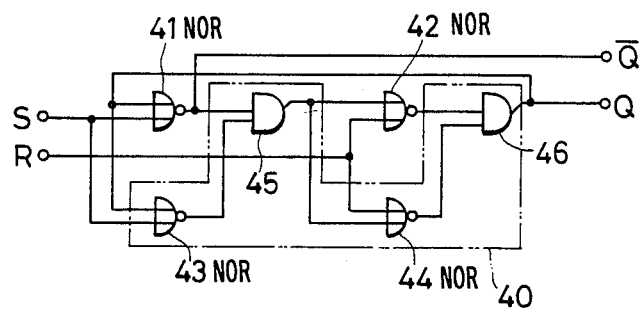
FIG. 4 is a structural view of another circuit when the present invention is applied to the RS latch circuit.

When the error mode is opposite to the above, that is, when the error occurs from the Low logic level to the High level, the feedback of the error signal can be prevented by limiting the doubled signal by the AND gates 45 and 46 as shown in FIG. 4.

Figure 5:
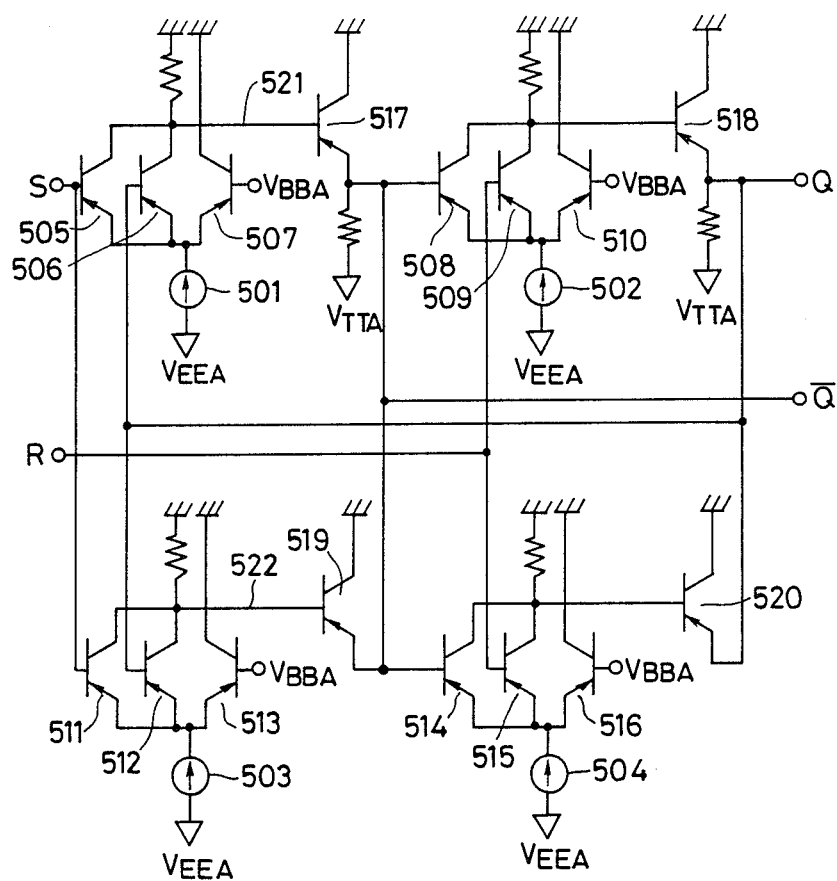
FIG. 5 is a circuit diagram when the circuit shown in FIG. 3 is embodied by PNP transistors.

FIG. 5 is a circuit diagram showing a definite example of the circuit With AND gates. This embodiment is also in agreement with an embodiment wherein the circuit shown in FIG. 3 is embodied by PNP transistors. Therefore, the detailed explanation of this circuit is omitted. However, since the circuit consists of the PNP transistors, the error mode of the soft error is opposite to that of the circuit of FIG. 3 as described above, and the error occurs from the Low level to the High level. As described above, since the gate circuit is doubled, the soft error is difficult to occur. More definitely, the feedback of the error signal is prevented by calculating AND logic (OR of the Low level) or wired-AND of the doubled signals 521 and 522 by the emitter follower transistors 517 and 519 as shown in the drawing.

Though the gates that constitute the latches are NOR gates in FIGS. 2 and 4, the effect is exactly the same when the latches are constituted by NAND gates.

Figure 6:
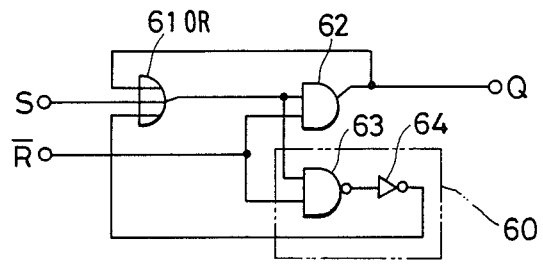
FIG. 6 is a structural view of other circuits of the latch shown in FIG. 1.

FIG. 6 shows another example of the latch 1 shown in FIG. 1. In the drawing, the OR circuit 61 and the AND circuit 62 together constitute the feedback loop. The portion encompassed by dash lines is the portion that is added to the conventional circuit. This embodiment deals with the case where only the AND circuit 62 and the inverter 64 have the error mode of from the High logic level to the Low level, and OR of the doubled signal is obtained by the 0R circuit 61. The NAND circuit 63 and the inverter 64 can be replaced by one AND circuit, but the construction of this embodiment is simpler depending upon the devices used. Since doubling may be made only for the gates which are likely to cause error in this embodiment, the increase of the number of devices due to doubling can be reduced to the minimum possible extent.

Figure 7:
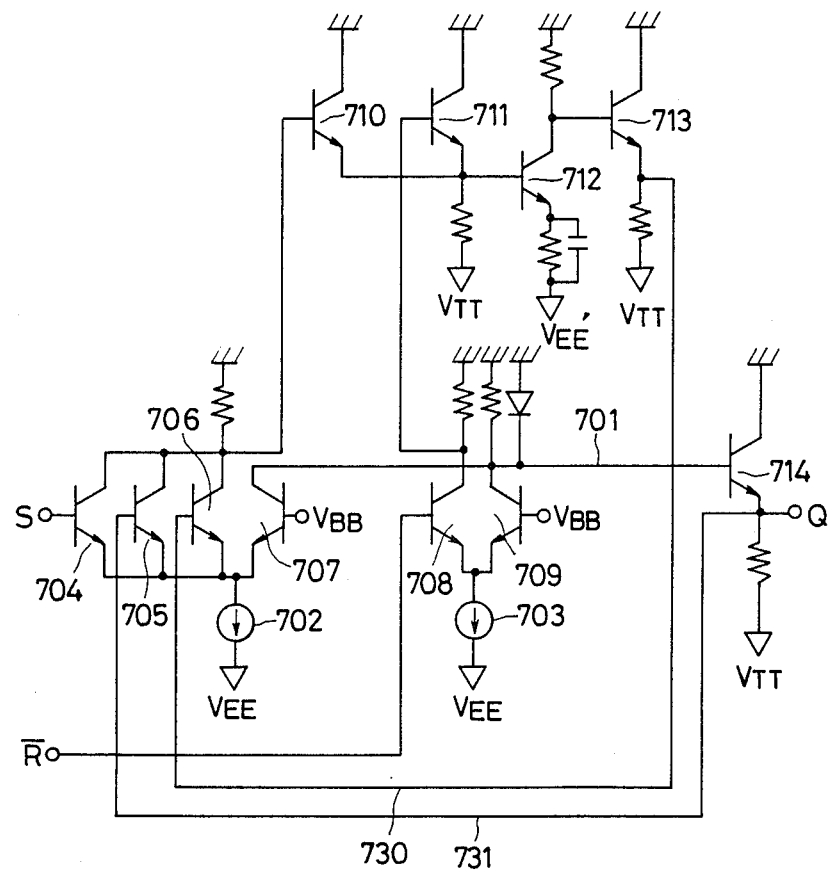
FIG. 7 is a circuit diagram when the circuits shown in FIG. 6 are embodied.

FIG. 7 shows one of the definite examples of the circuit shown in FIG. 6 and illustrates the case where the bipolar ECL circuit is used. The circuit consists of the constant current generators 702, 703, the differential circuit portions 704–707 and 708, 709 connected respectively to the constant current generators 702 and 703 and the inverter circuit having a transistor 712 and the like.

As explained with reference to the embodiment shown in FIG. 6, this embodiment is suitable for the case where only the AND circuit 62 and the inverter 64 have the error mode of from the High logic level to the Low level.

Furthermore, the AND circuit 62 in FIG. 6 corresponds to a collector dot portion (wired-AND) 701 and the inverter 64 does to 712.

As described above, when the α ray is incident to the transistors 707, 709 connected to the collector dot and to the transistor 712 constituting the inverter, the collector potentials of these transistors change from the High level to the Low level. However, since the feedback portion is doubled by 730 and 731 in this embodiment, data inversion (or the soft error) does not occur unless the α ray is incident simultaneously to the collector dot portion and the inverter portion.

Figure 8:
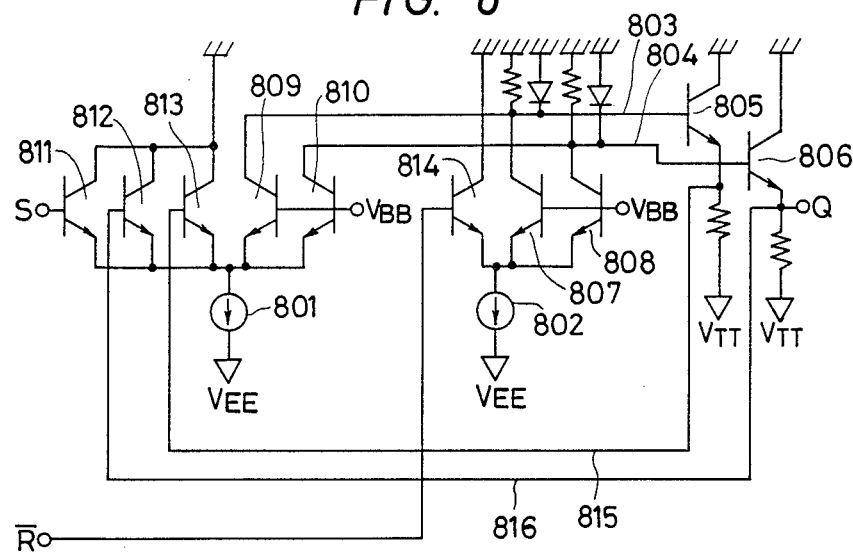
FIG. 8 is another circuit diagram when the circuits shown in FIG. 6 are embodied.

FIG. 8 shows another definite example of the circuit shown in FIG. 6. The drawing illustrates the case where the bipolar ECL circuit is employed. Reference numerals 801, 802 represents the constant current generators, 805 and 806 are emitter follower circuits and 803 and 804 are collector dot portions. In this embodiment, when the α ray is incident to any of the transistors 809, 810, 807 and 808, the collector potential of that transistor drops. However, since two sets of collector dots 803 and 804 are provided and the feedback portions 815 and 816 are doubled as in the drawing, the soft error cannot occur unless the α ray is incident simultaneously to two sets of transistors 809 or 807 and 810 or 808 connected to the collector dots 803 and 804. In this embodiment, even if the α ray is incident to the transistors 811, 812, 813, and 814, the level change does not occur because the collector side is connected to the ground level.

Figure 9:
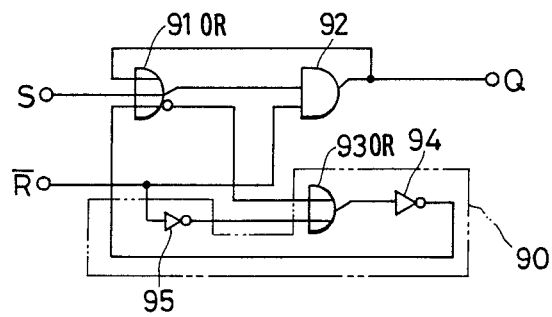
FIG. 9 is a modified circuit diagram of the circuit shown in FIG. 6.

FIG. 9 shows a circuit which prevents the soft error by adding a circuit 90 to the latch constituted by the OR circuit 91 and the AND circuit 92 in the same way as in FIG. 6. The error mode in this embodiment is such that only the AND circuit 92 and the inverter 94 cause the error from the High level to the Low level in the same way as in FIG. 6. The circuit shown in FIG. 9 is equivalent to the circuit shown in FIG. 6 from the De Morgan's rules, and its definite circuit is such as shown in FIG. 7.

Figure 10:
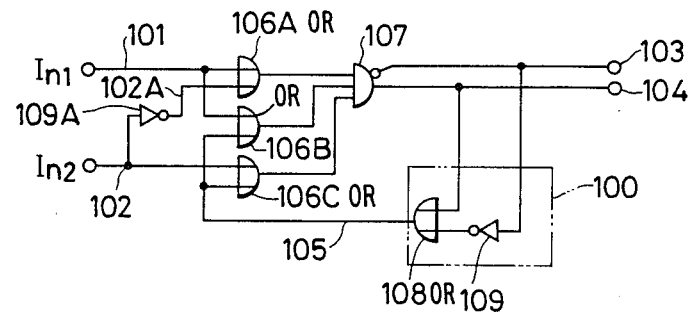
FIG. 10 is a circuit diagram of a D-type flip-flop circuit using the latch shown in FIG. 9.
Figure 28:
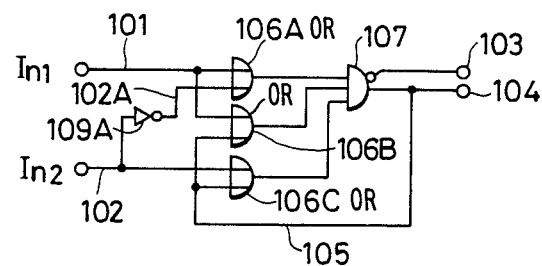
FIG. 28 is a circuit diagram of a gate circuit in a conventional flip-flop circuit.

FIG. 10 shows the construction of a D type flip-flop using the latch shown in FIG. 9. In comparison with the conventional flip-flop shown in FIG. 28, this embodiment is characterized in that the circuit 100 is afresh added. The input signals of this circuit 100 are the output signal 104 of this flip-flop circuit and its inversed output signal 103, and since the inversed output signal 103 is inverted by the inverter circuit 109, the two input signals to the OR gate 108 have logically the same phase. Therefore, during the normal operation without any influence of the α ray, the feedback signal 105 exhibits the same operation as that of the original flip-flop shown in FIG. 28.

Figure 11:
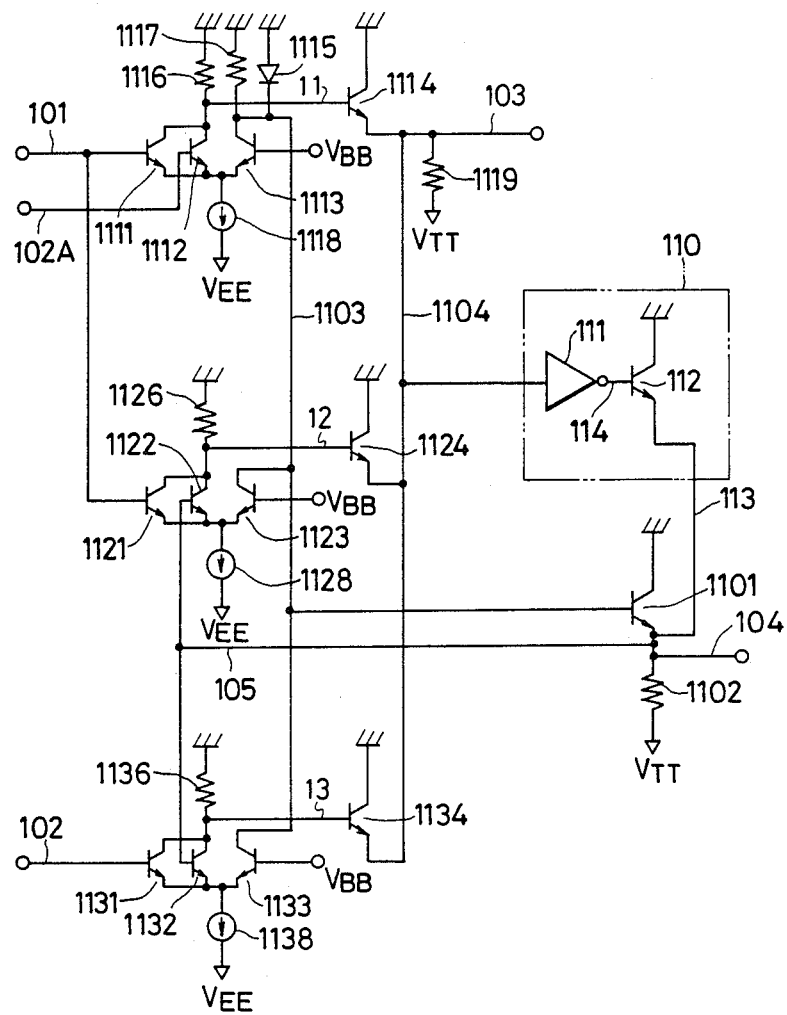
FIG. 11 is a circuit diagram when the circuit shown in FIG. 10 is embodied.

A circuit shown in FIG. 11 can be conceived as a circuit construction to realize the circuit of FIG. 10. As shown in the drawing, the increase of the number of devices due to doubling is extremely small if doubling is made at the transistor level. The circuit is exactly the same as that of the conventional flip-flop circuit shown in FIG. 29 except for the circuit 110. The inverter 109 in FIG. 10 corresponds to 111 of FIG. 11. As to the OR gate 108 of FIG. 10, since the emitters of the transistors 112 and 1101 are wired (113) in FIG. 11, logical OR is obtained. In the same way as in the circuit shown in FIG. 10, the flip-flop circuit shown in FIG. 11 exhibits exactly the same circuit operation as the conventional flip-flop circuit during its normal operation devoid of any influence of the α ray.

Next, the operation of the circuit of FIG. 11 when the α ray is incident will be described. The influence of the α ray appears as the drop of the collector level when the α ray is incident to the collector of any of the transistors 1113, 1123 and 1133 as described already. Therefore, the problem occurs when the common collector level 1103 is at the High logic level. In other words, when the High logic level is reduced by the α ray noise to a level that can be regarded as the Low level and if this level drop is fed back, the flip-flop is inversed and its data is lost. In the conventional flip-flops, the common collector level 1103 is as such fed back through the emitter followers so that this inversion is unavoidable. In the flip-flop of FIG. 11 in accordance with this embodiment, however, the feedback signal 105 is produced by the circuit 110 and the wiring 113 as logic OR between the common collector level 1103 and the inversion signal 114 of the inversed output signal 1104 (103) of the latch. Therefore, even if the common collector level 1103 changes from the High logic level to the Low level due to the α ray noise, the feedback signal 105 keeps the High level and the data of the latch circuit is not lost provided that the inversion signal 114 of the inversed output signal 1104 remains at the High level. The inversion signal 114 of the inversed output signal 1104 is obtained from the transistor which is separate from the common collector level 1103. Therefore, it does not happen that one α ray simultaneously reduce the common collector level 1103 and the inversion signal 114 of the inversed output signal 1104 from the High level to the Low level.

On the other hand, when the common collector level 1103 is at the Low level, the inversed output signal 1104 is at the High level, so that there is the possibility this time that the level of 1104 is reduced by the α ray noise. In this case, however, the error does not occur unless the α ray is incident simultaneously to the constant current generator 1128 and to the transistors on the negation side of the current switch represented by 1138. In other words, the possibility that the α ray is incident simultaneously to the collector of the transistor 1121 (or 1122) and to the collector of the transistor 1131 (or 1132) can be neglected. Therefore, the soft error of the latch circuit due to the incident α ray can almost be neglected.

Figure 12:
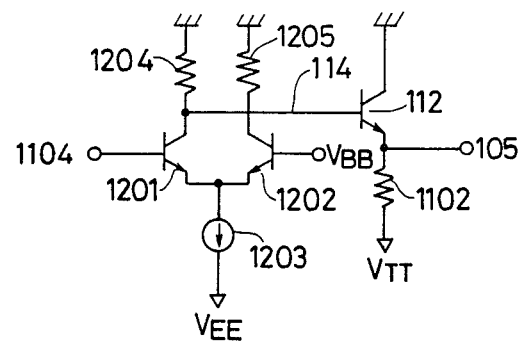
FIG. 12 is a first embodied circuit diagram of circuit part 110 of FIG. 11.

FIG. 12 shows a method of constituting the circuit 110 shown in FIG. 11. The circuit 110 uses the ECL circuit which changes over the constant current generator 1203 by the transistors 1201 and 1202.

Figure 13:
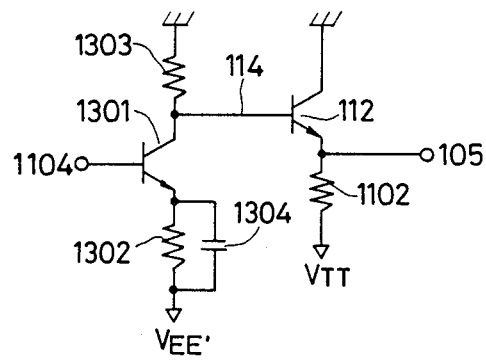
FIG. 13 is a second embodied circuit diagram of circuit part 110 of FIG. 11.

FIG. 13 shows another circuit construction of the circuit 110 shown in FIG. 11, and the circuit obtains the feedback signal 105 from the collector of the transistor 1301 through the emitter follower 112.

In the foregoing embodiments, the output 1104 (103) on the negation side of the flip-flop is as such used as the input signal to the inverter 111. In other words, the wired-OR of the transistors 1114, 1124 and 1134 is used, but it is also possible to apply the input signal to the inverter 111 by disposing afresh three transistors separately from the transistors described above and connecting them in the same way as the transistors 1114, 1124 and 1134, respectively.

In the foregoing embodiments, the output signal 104 of the latch is obtained by the emitter follower transistor 1101 in the same way as the feedback signal 105, but it can be obtained by different transistors. In other words, the common collector of the transistors 1113, 1123 and 1133 is connected to the base in the same way as the transistor 1101 and the output signal 104 can be obtained from the emitter.

Figure 14:
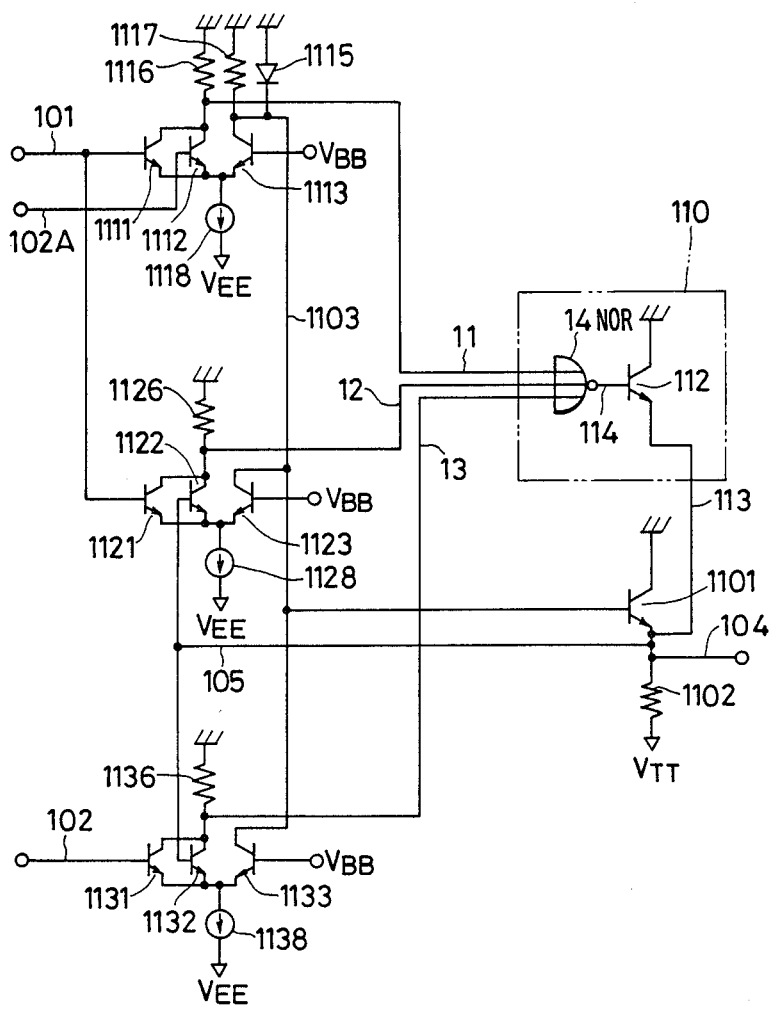
FIG. 14 is a modified circuit diagram of FIG. 11.
Figure 15:
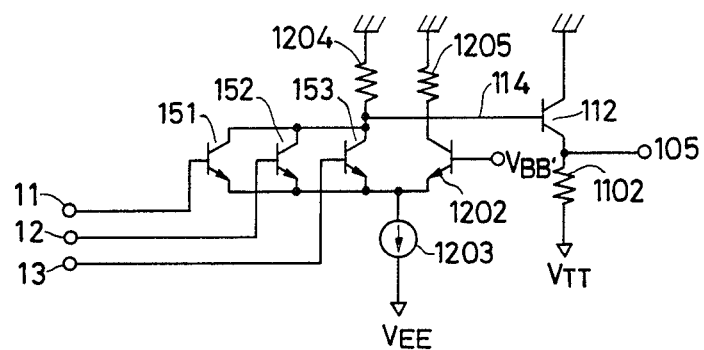
FIG. 15 is a first embodied circuit diagram of circuit part 110 of FIG. 14.
Figure 16:
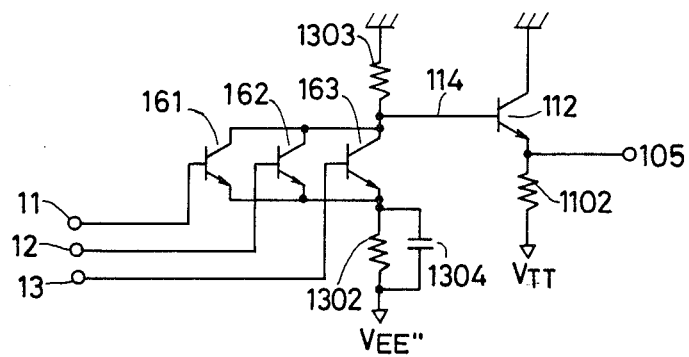
FIG. 16 is a second embodied circuit diagram of circuit part 110 of FIG. 14.

FIG. 14 shows still another circuit construction to realize the circuit shown in FIG. 10. This circuit does not use the inversed output signal 1104 of the flip-flop, which is used in the circuit shown in FIG. 11, as the input signal to the circuit 110 but uses directly the collector potentials 11, 12, 13 of the current switches represented by the constant current generators 1118, 1128 and 1138 as the input signal to the circuit 110, so that the operation speed of the feedback circuit can be speed up. In this instance, the NOR gate 14 is used in place of the inverter 111. As this gate 14, the number of inputs of the circuits shown in FIGS. 12 and 13 is increased and the circuits such as shown in FIGS. 15 and 16 can be used. In other words, the OR of the inversed output signal 11, 12, 13 of each current switch is obtained by the wired- OR 1104 and is inversed by the circuit 111 in FIG. 11, but these operations are altogether made by the gate 14 in FIG. 14 so that the circuit operation can be speed up. As the NOR gate, the stability obtained by use of the constant current generators shown in FIG. 15 and the high speed operation obtained by eliminating the use of the threshold value shown in FIG. 16 can be combined in the circuit arrangement shown in FIG. 17. Here, the division ratio of resistors 335 and 336 is determined in consideration of the operation speed and the signal level. An electrostatic capacitance 338 is a speedup capacitance and can speed up the NOR output.

In the circuit of FIG. 14, the inversed output signal 103 of the latch is not shown, but it can be made the same as the one shown in FIG. 11. As to the output signal 104, the emitter follower transistors can be used separately for the output and for the feedback as explained with reference to FIG. 11.

Figure 18:
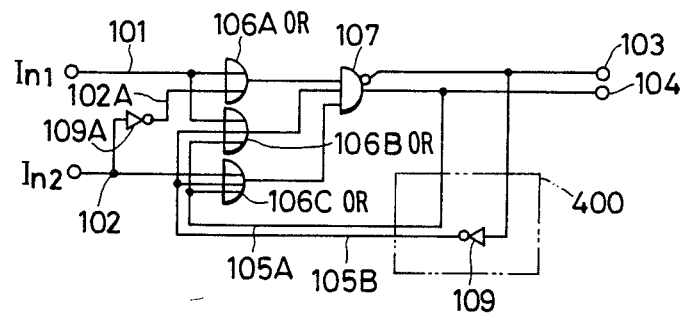
FIG. 18 is another modified circuit diagram of FIG. 10.

FIG. 18 shows still another embodiment of the present invention. In comparison with the embodiment shown in FIG. 10, this embodiment is different in that the OR gate 108 does not exist but the number of inputs of the OR gates 106B and 106C is changed from 2-input to 3-input. If the number of inputs can be increased, this circuit arrangement can speed up the circuit operation speed. As a definite construction of each gate shown in FIG. 18, the same construction as in the embodiment shown in FIG. 10 can be employed.

Figure 19:
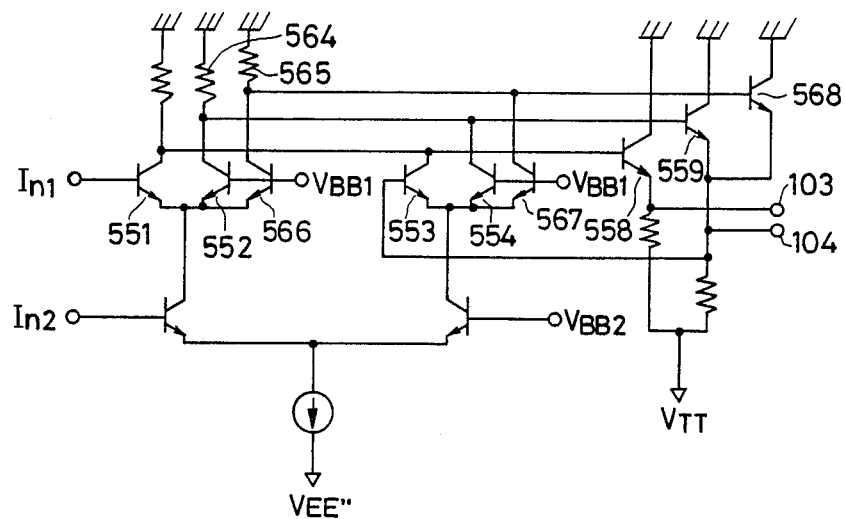
FIG. 19 is a circuit diagram when the present invention is applied to a flip-flop circuit by means of a series gate ECL.
Figure 33:
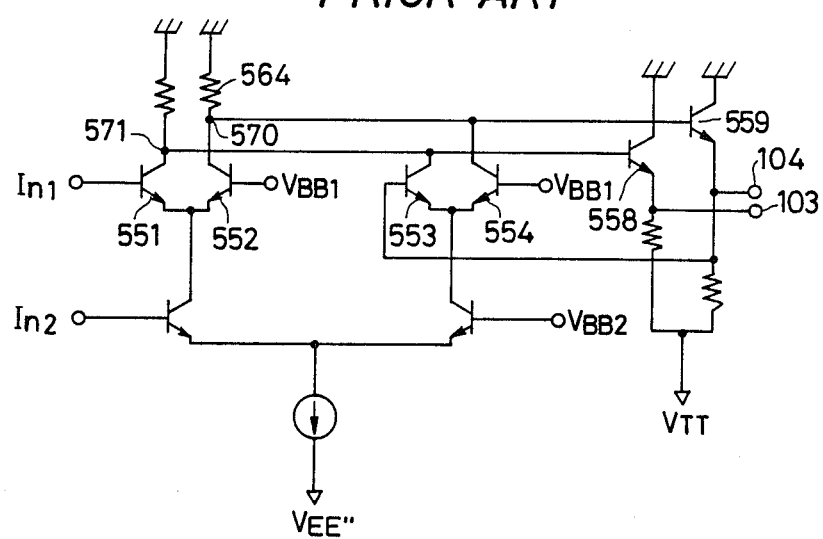
FIG. 33 is a circuit diagram of a conventional flip-flop circuit by series gate ECL.

FIG. 19 shows still another embodiment of the present invention. Unlike the foregoing embodiments, this embodiment uses counter-measures for the α ray for a flip-flop by a stacked ECL circuit, or so-called "series gate ECL". In FIG. 33 which shows the conventional circuit, the correlation between the data input $I_{nl}$, the clock signal $I_{n2}$, the output signal 104 of the latch and its inversed output signal 103 is exactly the same as that in FIG. 28. The operation is as follows. When the clock signal $I_{n2}$ is higher than the reference voltage $V_{BB2}$, a current flows either one of the transistor pair 551 and 552 in accordance with the data input $I_{nl}$. On the other hand, when the clock signal $I_{n2}$ is lower than the reference voltage $V_{BB2}$, the current flows either one of the transistor pair 553 and 554 and the data is held. Feedback for keeping the data is made from the output signal 104 of the latch to the base of the transistor 553.

In this embodiment, it is only when the α ray is incident to the collectors of the transistors 552 and 554 for producing the output signal 104 that the error occurs due to the incident α ray, and moreover, its output is at the High level.

Therefore, as shown in FIG. 19, the transistors 566 and 567 are disposed in parallel with the transistors 552 and 554, respectively, in order to cope with the α ray, but their collectors are separated from one another and are connected to separate load resistors as represented by 564 and 565 so as to obtain the logical OR by the wired-OR of the transistors 559 and 568 and to use it as the feedback signal. According to this arrangement, the soft error does not occur unless the α ray is incident simultaneously to the transistor 552 (or 554) and to the transistor 566 (or 567).

In this embodiment, the data holding transistor pair 553, 554 in the series gate ECL circuit is constructed in such a manner as to provide the reference voltage $V_{BB1}$ to the base of the transistor 554, but a method which applies signals having mutually opposite phases to the bases of these transistors 553, 554 can be employed. In other words, the inversed output signal 103 can be applied to the base of the transistor 554. In this case, doubling is made to the inversed output signal in the same way as in FIG. 19 and the soft error by the α ray can be prevented by so doing.

Though this embodiment uses the same signal as the latch output and the feedback signals, the flip-flop output and the feedback signals can be separated by connecting different emitter follower transistors as already explained with reference to the embodiment shown in FIG. 11.

Figure 21:
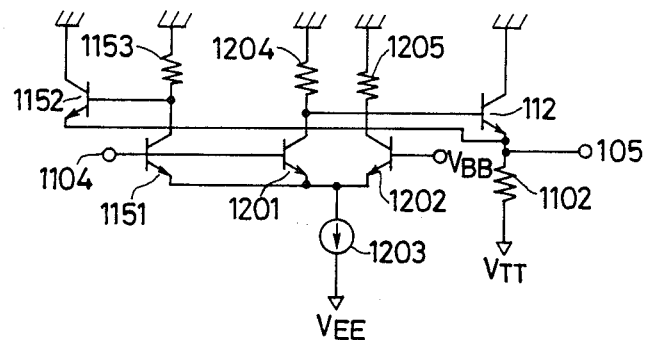
FIG. 21 is a circuit diagram embodying a part of the circuit shown in FIG. 20.
Figure 20:
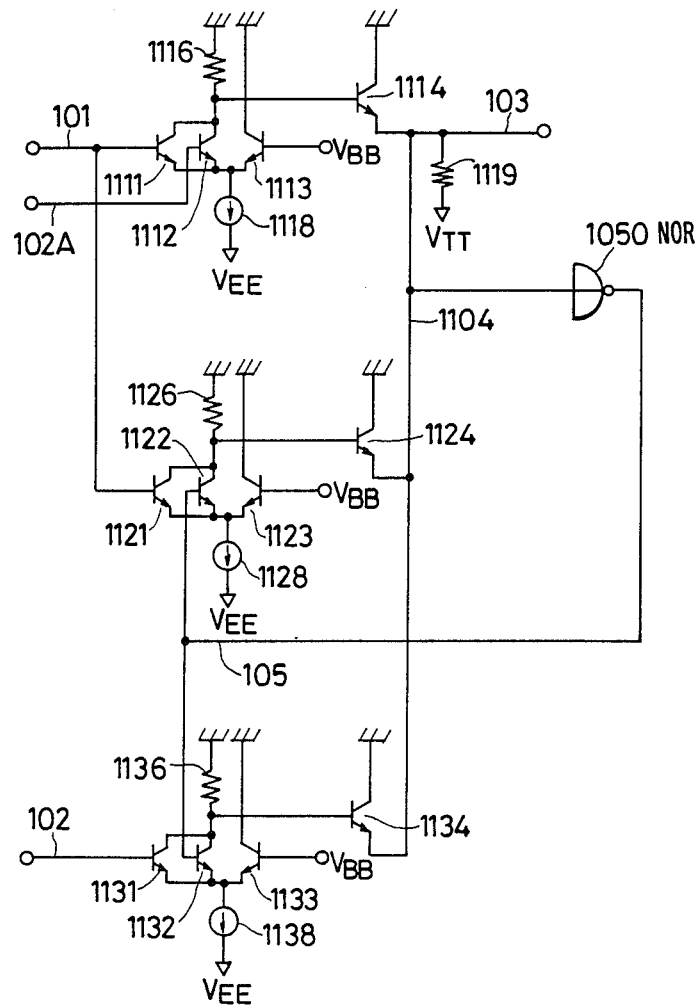
FIG. 20 is a modified circuit diagram of FIG. 11.

FIG. 20 shows still another embodiment of the present invention. This embodiment illustrates one of the circuit constructions in order to accomplish the circuit shown in FIG. 10, and deals with the case where only NOR logic can be obtained due to the power source voltage or the like, unlike the embodiment shown in FIG. 11. In order to obtain the feedback signal 105, therefore, the inversed output signal 1104 of the flip-flop is inversed by the NOR gate 1050. In this embodiment, the soft error due to the α ray can occur only when the α ray is incident to the gate 1050. Therefore, a circuit such as shown in FIG. 21 is used as the gate 1050. In this circuit, the portion consisting of the transistors 1201, 112 and the resistor 1204 of FIG. 12 is doubled by the transistors 1151, 1152 and the resistor 1153. The soft error does not occur unless the α ray is incident simultaneously to the collectors of the transistors 1201 and 1151. Therefore, the α ray soft error becomes extremely small in practice.

Figure 17:
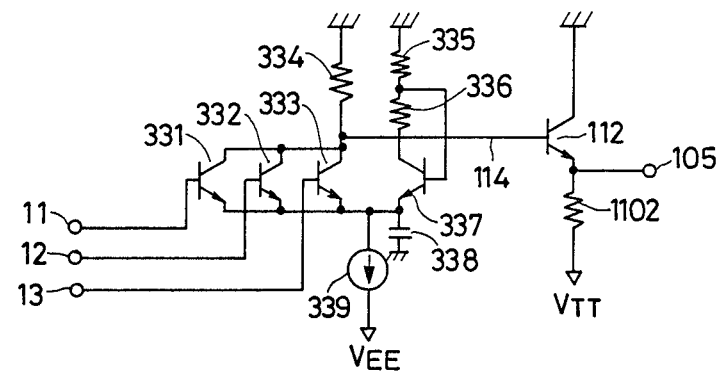
FIG. 17 is a third embodied circuit diagram of circuit part 110 of FIG. 14.

Doubling can also be made in the same way as in FIGS. 13 and 17 in place of the arrangement shown in FIG. 12.

Figure 22:
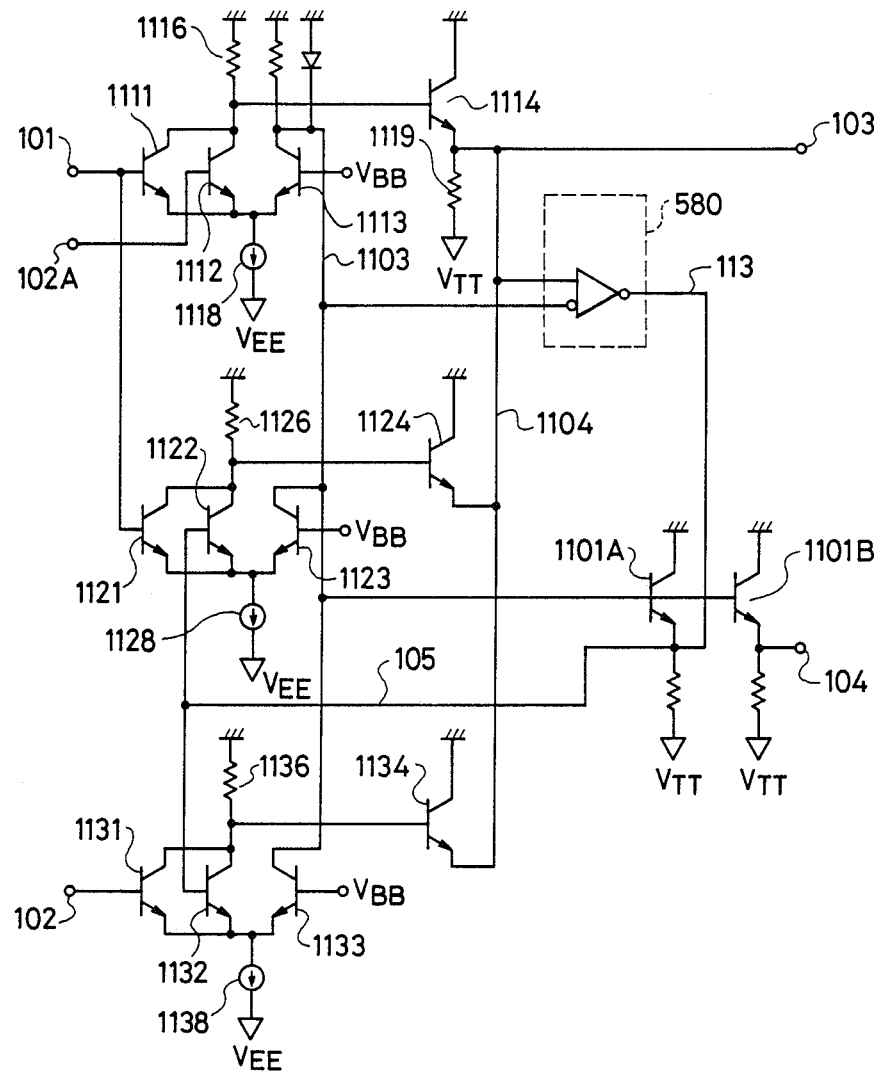
FIG. 22 is another modified circuit diagram of FIG. 11.

FIG. 22 is a circuit diagram illustrating a further embodiment of the present invention. In this embodiment, the circuit 110 of the embodiment of FIG. 11 is replaced by a circuit 580 which is a differential-input circuit and which includes the transistor 112 of the circuit 111 of FIG. 11. Unlike the case of FIG. 11, this embodiment is effective for the causes where α ray noise may also develop in the feedback signal 1104 of the inversed side.

Described below is the operation of the embodiment of FIG. 22 when the α ray is incident.

When the α ray is incident upon the collector of, for example, any one of the transistor 1113, 1123 or 1133, the collector potential drops. When the collector of, for example, the transistor 1113 is assuming a logically high level, therefore, if the potential drops to a logically low level being cause by the α ray, the drop of potential is fed back and whereby the flip-flop is inverted and the data is lost.

In this embodiment, however, provision is made of the differential input circuit 580 to increase the margin against the α rays. If the α ray is incident upon the collector of any transistor under the condition where the feedback signal line 105 is assuming the low level, i.e., where the potential is all of the high level at points at which the resistors 1116, 1126 and 1136 are connected to their respective collectors, then the collector potential drops, the potential of the common emitter 1104 drops, and noise generates in the output 113 of the circuit 580 so that it may change from the low level to the high level. However, since the circuit 580 in this embodiment works as a differential-input circuit, the input margin can be increased, the noise level can be suppressed on the output 113 side, and the soft error is prevented from developing when the feedback signal 105 changes from the low level to the high level. Further, even when the feedback signal 105 is of the high level, i.e., even when the common collector is of the high level, the noise may generate so that the output 113 changes from the high level to the low level because of the same reason as described above. However, this noise level can also be suppressed to prevent the soft error from developing when the feedback signal 105 changes from the high level to the low level.

Figure 23:
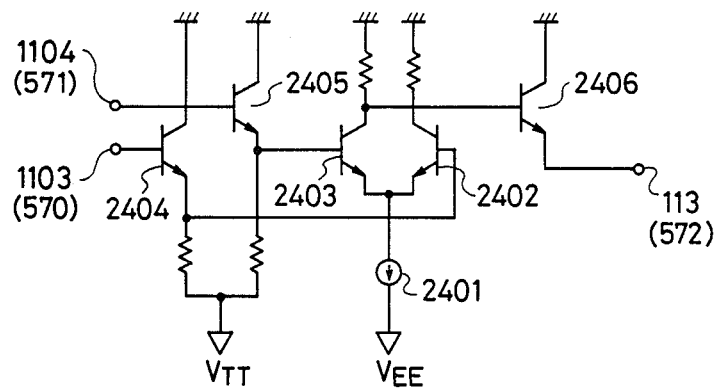
FIG. 23 is an embodied circuit diagram of inverter circuit 580 of FIG. 22.

FIG. 23 is a diagram illustrating in detail the circuit structure of the differential circuit 580 of FIG. 22. The differential circuit consists of a constant cuttent source 2401, differential transistors 2402 and 2403 connected thereto, and emitter follower transistors 2404, 2405 and 2406, and utilizes an ECL circuit of differential input.

Figure 24:
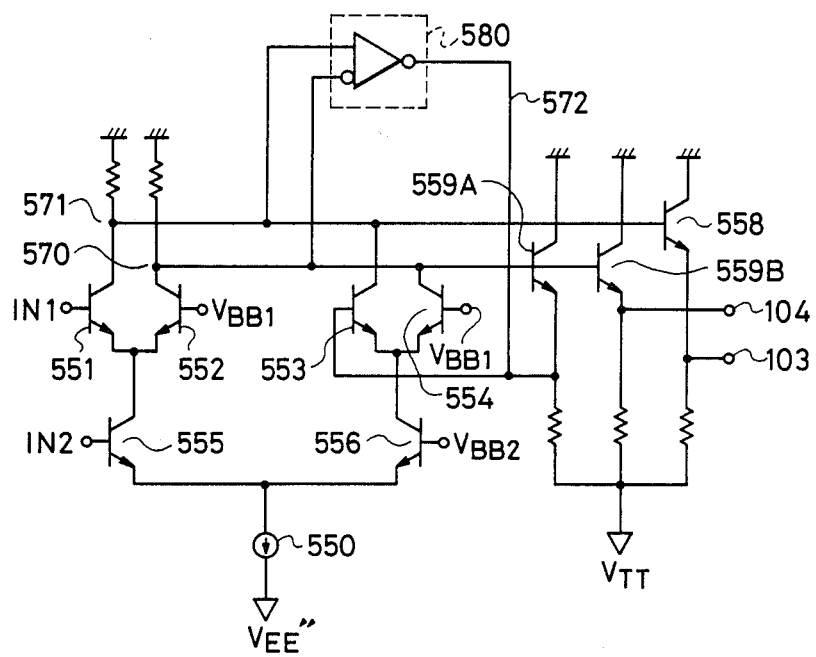
FIG. 24 is another circuit diagram when the present invention is applied to a flip-flop circuit by means of a series gate ECL.

Still further embodiment of the present invention will be described in conjunction with FIG. 24. In this embodiment, the flip-flop circuit relying upon a series gate ECL circuit is designed to be resistant against the α rays in the same manner as in FIG. 22. In FIG. 24, reference numeral 550 denotes a constant current source, 551 to 556 denote bipolar transistors that constitute a differential circuit, and 558, 559A and 559B denote emitter-follower transistors. The data input IN1, clock input IN2, latch output 104 and inverted output 103, are the same as those of the circuit of FIG. 19. In this embodiment, however, the transistor 559 of FIG. 19 is comprised of a transistor 559A for feedback and a transistor 559B for producing output.

The differential circuit 580 is constructed as shown in FIG. 23.

Described below is the operation when the α ray is incident in conjunction with FIG. 24. The effect of α ray appears in such a form that when the α ray is incident upon the collector of either one of the transistor 552 or 554, the collector potential drops. Therefore, if the collector potential is dropped by the α ray to such a degree that can be regarded to be the logically low level under the condition where the collector of the transistor 552 is assuming the logically high level, the drop of potential may be fed back so that the flip-flop is inverted to lose the data. In a conventional circuit of FIG. 33 in which the potential of a common collector 570 was directly fed back through an emitter follower 559, it was not possible to avoid the stored data from inverting (i.e., it was not possible to avoid the development of soft error). In the circuit of this embodiment, on the other hand, the feedback signal 573 is doubled by the differential circuit 580 and the wire 572. Furthermore, since the circuit 580 works for differential input, the margin increases for the α rays.

If the α ray is incident upon the collector under the condition where the feedback signal 573 is of the low level, i.e., where the common collector 571 is assuming the high level, the potential of the common collector 571 is pulled down and noise generates in the output 572 of the differential circuit 580 so that it changes from the low level to the high level. In this embodiment, however, since the differential circuit 580 receives the differential input, the input margin can be increased to suppress the noise level on the output side 572. This makes it possible to prevent the soft error from developing when the feedback signal 573 changes from the low level to the high level. Noise may further generate in the output 572 of the differential circuit 580 so that it changes from the high level to the low level when the α ray is incident upon the common collector 570 under the condition where the feedback signal line 573 is assuming the high level, i.e., where the common collector 570 is assuming the high level. The noise, however, can be suppressed to a small level, making it possible to prevent soft error from developing when the feedback signal 573 changes from the high level to the low level. Further, even when the α ray is incident under the condition where the output 572 of the differential circuit 580 is assuming the high level and even when the output 572 is changed from the high level to the low level, wired OR (doubled feedback signal) is established relative to the common collector 570 through the emitter follower 559A, and the feedback signal 573 does not so change as to develop soft error. When the output 572 is of the low level, on the other hand, the output potential further decreases but theoretically there arises no problem. When the α ray is incident almost simultaneously on the differential circuit 580 and on the common collector, the potential of the feedback signal line 573 changes from the high level to the low level, so that soft error may develop. In fact, however, probability is very small in which the α ray falls nearly simultaneously on the nodes (differential circuit 580 and common collector 570) to generate soft error, and can be neglected.

In this embodiment in which the emitter follower 559A connected to the feedback signal 573 and the emitter follower 559B of the output 104 are separated as shown, it is allowed to prevent the delay time from decreasing when the output level 104 changes from the logically high level to the logically low level. This is because, if the emitter follower is not separated, the output of the differential circuit 580 and the output of the common collector 570 establish wired OR structure since the feedback signal is doubled. When the OR output changes from the high level to the low level, therefore, the time of level change is determined by either signal that is lagged (determined by a signal that passes through the differential circuit 580 in this embodiment).

Figure 25:
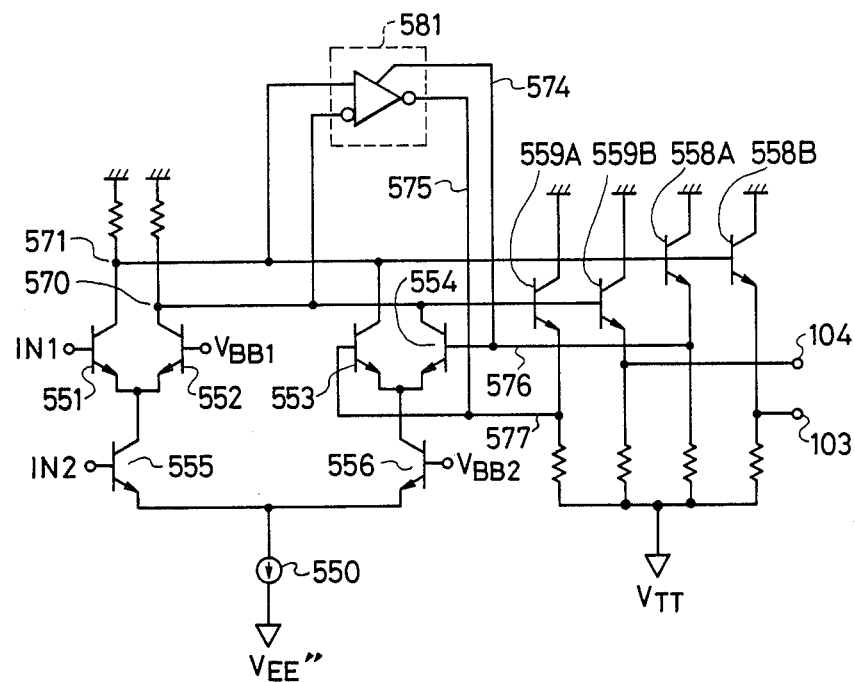
FIG. 25 is a modified circuit diagram of FIG. 24.

FIG. 25 illustrates a still further embodiment concerned to the flip-flop of the series gate circuit. Compared to the embodiment of FIG. 24, this embodiment is different in regard to the structure of the circuit 580 and to the feedback signal line 573 in FIG. 24. However, the operation of the flip-flop and the operation when the α ray is incident are the same as those of FIG. 24, and are not described here.

The circuit 580 of FIG. 24 constitutes a differential input—differential output circuit as represented by a circuit 581 in FIG. 25, and the outputs 574 and 575 thereof are connected to feedback signal lines 576 and 577 that hold the data. By differentiating the base input to the transistors 553 and 554 that hold the data, as described above, the margin can be increased for the noise generated by α rays. According to this embodiment, therefore, a flip-flop circuit can be constituted that is resistant against soft error caused by α rays.

Figure 26:
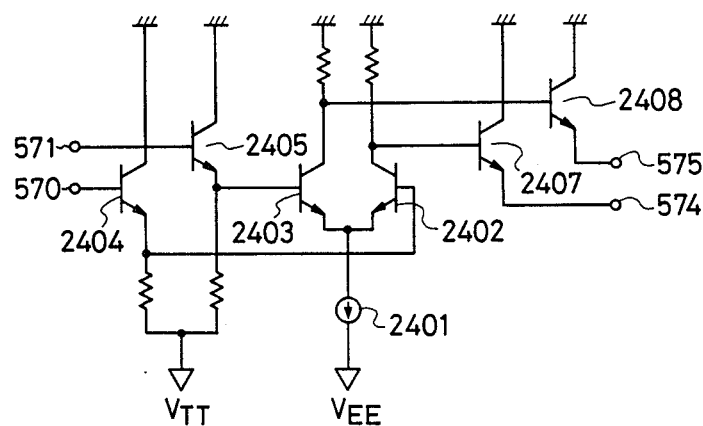
FIG. 26 is an embodied circuit diagram of the invention circuit 581 of FIG. 25.

FIG. 26 is a diagram which illustrates in detail the structure of the circuit 581 of FIG. 25. Though the fundamental circuit structure is the same as that of FIG. 23, it produces output 574 and inverted output 575 based upon a so-called differential output structure.

Figure 27:
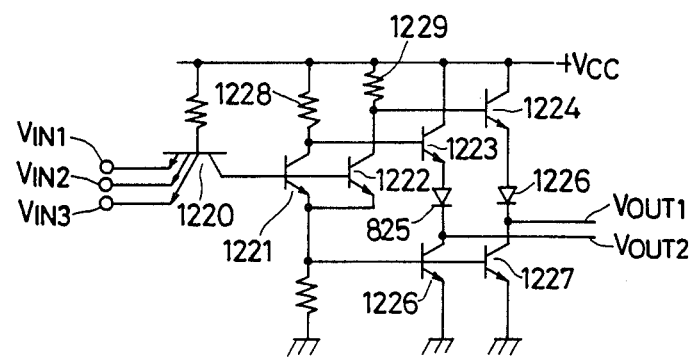
FIG. 27 is a circuit diagram when the present invention is embodied by TTL.

The description that has been given so far illustrates primarily the embodiments of doubling at the transistor level in the bipolar ECL circuit, but doubling can be made for TTL circuits, for example, on the basis of the same technical concept. FIG. 27 shows an example in which the basic gate of TTL is doubled. If a flip-flop is assembled by use of such gates, the increase of the number of devices becomes smaller than when doubling is made at the gate level. In FIG. 27, the transistors 1224, 1227, the diode 1226 and the resistor 1229 represent the doubled portion.

No essential changes occur when PNP transistors are used in place of the NPN transistors that have so far been illustrated, except that the noise current due to the α ray flows from the substrate to the collector, and the circuit operation remains unchanged. However, since the error mode in this case is from the Low logic level to the High level, the doubled signal must be produced by AND.

As described at the opening paragraph of the description of the embodiment, N-channel FETs and P-channel FETs exhibit the same circuit operations with respect to the α ray in the manner corresponding to the NPN transistors and the PNP transistors, respectively. Therefore, the technical concept of the embodiments using the bipolar transistor can be applied as such to these FETs.

As described above, the present invention can accomplish a flip-flop circuit which is resistant to the α ray and does not cause the soft error without deteriorating the ordinary latch operation and without increasing drastically the number of necessary device.

What is claimed is:

1. A flip-flop circuit comprising:
   a first logic means having a first gate for receiving a first input signal and a second gate for receiving a second input signal;
   a second logic means having a third gate for receiving said first input signal and a fourth gate for receiving said second input signal; and
   a third logic means having a fifth gate having inputs coupled to outputs of said first and third gates and having an output coupled to inputs of said second and fourth gates, said third logic means further including a sixth gate having inputs coupled to outputs of said second and fourth gates and having an output coupled to inputs of said first and third gates, so that said fifth gate provides a first feedback path from the outputs of said first and third gates to the inputs of said second and fourth gates and said sixth gate provides a second feedback path from the output of said second and fourth gates to the inputs of said first and third gates,
   wherein said first and second feedback paths serve to reduce the generation of soft error in the operation of said flip-flop circuit.

2. A flip-flop circuit comprising:
   first logic means for receiving a first input signal and a feedback signal at first and second inputs thereof, respectively, and for providing a first logic signal at an output thereof in response to the first input signal and the feedback signal, wherein the logical level of the first logic signal can be changed to another logical level by soft errors;
   second logic means having inputs coupled to the first and second inputs of said first logic means, respectively, and which produces a second logic signal having the same logic level as the first logic signal;
   third logic means having inputs coupled to the outputs of said first and second logic means;
   fourth logic means having an input for receiving a second input signal and an input coupled to the output of said third logic means; and
   a feedback loop comprising said first, second, third and fourth logic means by feeding an output signal of said fourth logic means back to the second input of said first logic means as the feedback signal, the feedback loop having either one of two stable states, wherein the stable state can be changed by the first and second input signals.

3. A flip-flop circuit according to claim 2, further comprising:
   fifth logic means which has inputs for receiving the second signal and the output signal of said third logic means respectively; and
   sixth logic means having inputs coupled to outputs of said fourth and fifth logic means, wherein an output signal of said sixth logic means is fed back to the second input of said first logic means as the feedback signal.

4. A flip-flop circuit according to claim 2, wherein said third logic means is combined with said fourth logic means as a single three-input logic means.

5. A flip-flop circuit according to claim 4, wherein said third logic means is comprised of an OR gate which receives the first and second logic signals and the second input signal.

6. A flip-flop circuit according to claim 5, wherein said second logic means is comprised of a NAND gate and an inverter.

7. A flip-flop circuit according to claim 2, wherein said first logic means has a transistor circuit which is comprised of two or more transistors having emitters connected together and which receive at least the first input signal and the feedback signal through bases thereof, and wherein the first logic signal is obtained from collectors of the transistors that are provided with the first input signal and the feedback signal through the bases thereof.

8. A flip-flop circuit according to claim 7, wherein said fourth logic means has a transistor circuit which is comprised of two or more transistors having emitters connected together and which receive at least the second input signal and the output signal of said third logic means through bases thereof, and wherein the feedback signal is obtained from collectors of the transistors that are provided with the second input signal and the output signal of said third logic means through the bases thereof.

9. A flip-flop circuit comprising:
   first logic means for receiving a first input signal and a feedback signal at first and second inputs thereof, respectively, and for providing first and third logic signals having opposite phase at outputs thereof, respectively, in response to the first input signal and the feedback signal, wherein the logical level of the first logic signal can be changed to another logical level by soft errors;
   second logic means which has an input for receiving the third logic signal, and which produces a second logic signal having the same logic level as the first logic signal;
   third logic means having inputs for receiving the first logic signal of said first and second logic signals of said second logic means;
   fourth logic means having an input for receiving a second input signal and an input coupled to the output of said third logic means; and
   a feedback loop comprising said first, second, third and fourth logic means by feeding an output signal of said fourth logic means back to the second input of said first logic means as the feedback signal, the feedback loop having either one of two stable states, wherein the stable state can be changed by the first and second input signals.

10. A flip-flop circuit according to claim 9, wherein said third logic means is combined with said fourth logic means as a single three-input logic means.

11. A flip-flop circuit according to claim 9, wherein said first logic means further comprises an inverter for receiving the second input signal and a logic gate having inputs for receiving the first input signal and output signal of said inverter and which produces an output signal to the first input of said first logic means.

12. A flip-flop circuit comprising:
first logic means for receiving first and second input signals and a feedback signal at first, second and third inputs thereof, respectively, and for providing first and third logic signals having opposite phase at outputs thereof, respectively, in response to the first and second input signals and the feedback signal, wherein the logical level of the first logic signal can be changed to another logical level by soft errors;
second logic means which has an input for receiving the third logic signal, and which produces a second logic signal having the same logic level as the first logic signal;
third logic means having inputs for receiving the first logic signal of said first logic means and the second logic signal of said second logic means; and
a feedback loop comprising said first, second and third logic means by feeding an output signal of said third logic means back to the third input of said first logic means as the feedback signal, the feedback loop having either one of two stable states, wherein the stable state can be changed by the first and second input signals.

13. A flip-flop circuit according to claim 12, wherein said third logic means is combined with said first logic means as a single three-input logic means.

14. A flip-flop circuit according to claim 12, wherein said first logic means is comprised of an inverter for receiving the second input signal, a first logic gate having inputs for receiving the first input signal and output signal of said inverter, a second logic gate having inputs for receiving the first input signal and the feedback signal, a third logic gate having inputs for receiving the second input signal and the feedback signal, and a fourth logic gate which receives output signals of said first, second and third gates and which produces the first and third logic signals.

15. A flip-flop circuit according to claim 12, wherein said first logic means has two or more transistor circuits each comprised of two or more transistors having emitters connected together and which receive one of the input signals and the feedback signal and a reference signal through bases thereof, wherein a logic signal which is obtained from a collector of the transistor that is provided with the reference signal through the base thereof is input to an AND gate in each of said transistor circuits, and wherein a logic signal which is obtained from collectors of the transistors that are provided with the first input signal and the feedback signal through the bases thereof is input to an OR gate in each of said transistor circuits, and wherein the output of said AND gate is used as the first logic signal and the output of said OR gate is used as the third logic signal.

16. A flip-flop circuit according to claim 15, wherein said second logic means is comprised of an inverter.

17. A flip-flop circuit according to claim 15, wherein said second logic means is comprised of a differential circuit which receives the first logic signal and the third logic signal, and which produces the second logic signal.

18. A flip-flop circuit according to claim 12, wherein said first logic means has two or more transistor circuits each comprised of two transistors having emitters connected together and which receive one of the input and feedback signals and a reference signal through bases thereof, wherein the first logic signal is obtained from a collector of the transistor that is provided with the reference signal through the base thereof, and the third logic signal is obtained from a collector of the transistor that is provided with one of the input and feedback signals through the base thereof.

19. A flip-flop circuit according to claim 18, wherein said second logic means is comprised of a differential circuit which receives the first logic signal and the third logic signal, and which produces the second logic signal.

20. A flip-flop circuit according to claim 18, wherein said third logic means is comprised of first and second emitter-follower transistors which receive the first logic signal and the third logic signal at bases thereof, respectively.

21. A flip-flop circuit according to claim 20, wherein said second logic means is comprised of a differential circuit which receives the first logic signal and the third logic signal, and which produces an out-of-phase output signal to the emitter of said first emitter-follower transistors and an in-phase output signal in the emitter of said second emitter-follower transistor.

22. A flip-flop circuit comprising:
first logic means having a first transistor circuit for receiving at least a first input signal at a first input and for providing first and third logic signals having opposite phase at first and second output nodes thereof, respectively, said first transistor circuit having two or more transistors, emitters of which are coupled to each other, one of the bases of which is coupled to the first input, one of the collectors of which is coupled to the first output node, and the other of the collectors of which is coupled to the second output node;
second logic means having a second transistor circuit which receives the third logic signal and which produces a third logic signal having the same logic level as the first logic signal; and
third logic means having a first emitter-follower transistor, a base of which is coupled to the first output node for receiving the first logic signal, and an emitter of which is coupled to an output of said second transistor circuit,
said first logic means having a third transistor circuit for receiving an output signal of said third logic means as a feedback signal, said third transistor circuit having two transistors, emitters of which are coupled to each other, one of the bases of which is coupled to the emitter of said first emitter-follower transistor, one of the collectors of which is coupled to the first output node, and the other of the collectors of which is coupled to the second output node, wherein a feedback loop comprises said first, second and third logic means, the feedback loop having either one of two stable states, wherein the stable state can be changed by the first input signal.

23. A flip-flop circuit according to claim 22, wherein said first logic means further comprises a fourth transistor circuit for receiving a second input signal, said fourth transistor circuit having two transistors, emitters of which are coupled to each other, one of the bases of which receives the second input signal, and collectors of which are coupled to the emitters of said first and third transistor circuits respectively, wherein the stable state can be changed by the first and second input signals.

24. A flip-flop circuit according to claim 22, wherein said second transistor circuit has an emitter-follower transistor, an emitter of which is coupled to the emitter of the first emitter-follower transistor.

25. A flip-flop circuit according to claim 22, wherein said second transistor circuit has an inverter circuit.

26. A flip-flop circuit according to claim 25, wherein said inverter circuit is comprised of a differential circuit, inputs of which are coupled to the first and second output nodes of said first transistor circuit, respectively.

27. A flip-flop circuit according to claim 23, wherein said third logic means further has a second emitter-follower transistor, a base of which is coupled to the second output node for receiving the third logic signal, and an emitter of which is coupled to the other base of said third transistor circuit.

28. A flip-flop circuit according to claim 27, wherein said second transistor circuit is comprised of a differential circuit, inputs of which are coupled to the first and second output nodes of said first transistor circuit, respectively, an out-of-phase output of which is coupled to the emitter of said first emitter-follower transistor and an in-phase output of which is coupled to the emitter of said second emitter-follower transistor.

* * * * *